United States Patent
Boettger

(10) Patent No.: US 9,880,214 B2
(45) Date of Patent: Jan. 30, 2018

(54) APPARATUS AND METHOD FOR DETECTION AND ADAPTION TO AN END-OF-LINE RESISTOR AND FOR GROUND FAULT LOCALIZATION

(71) Applicant: Honeywell International Inc., Morristown, NJ (US)

(72) Inventor: Donald M. Boettger, Millbury, MA (US)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 366 days.

(21) Appl. No.: 14/455,999

(22) Filed: Aug. 11, 2014

(65) Prior Publication Data
US 2015/0054522 A1   Feb. 26, 2015

Related U.S. Application Data

(60) Provisional application No. 61/868,385, filed on Aug. 21, 2013.

(51) Int. Cl.
G08B 21/00 (2006.01)
G01R 31/02 (2006.01)
(Continued)

(52) U.S. Cl.
CPC ....... G01R 31/024 (2013.01); G01R 19/0038 (2013.01); G08B 29/123 (2013.01); G08B 25/045 (2013.01)

(58) Field of Classification Search
CPC .... G08B 29/123; G08B 29/06; G08B 29/181; G08B 25/04; G08B 25/14; G08B 17/06;
(Continued)

(56) References Cited

U.S. PATENT DOCUMENTS

| | | | |
|---|---|---|---|
| 2006/0214811 A1* | 9/2006 | Barrieau | G08B 17/10 340/635 |
| 2007/0115111 A1* | 5/2007 | Girouard | G08B 3/10 340/507 |

(Continued)

FOREIGN PATENT DOCUMENTS

| | | |
|---|---|---|
| DE | 10 2010 047 227 B3 | 3/2012 |
| EP | 1 777 671 A1 | 4/2007 |
| WO | WO 2009/099662 A1 | 8/2009 |

OTHER PUBLICATIONS

Extended European search report from corresponding EP application 14180729.7, dated Jun. 3, 2015.

(Continued)

*Primary Examiner* — Alesa Allgood
(74) *Attorney, Agent, or Firm* — Husch Blackwell LLP

(57) ABSTRACT

An apparatus and method for detection and adaption to an end-of-line resistor in a notification appliance circuit (NAC) of a control panel or power booster of, for example, an alarm system, and for ground fault localization in the alarm system are provided. The apparatus can include the NAC where the NAC includes first and second analog input terminals, where the NAC includes first and second external output terminals, and where the NAC includes an end-of-line resistor. Current can be driven through the NAC via the first and second analog input terminals, and voltage can be measured at each of the first and second external output terminals. The measured voltage can be indicative of one of a value of the end-of-line resistor or that a state of the NAC is one of open, shorted, ground faulted, or normal.

6 Claims, 2 Drawing Sheets

(51) Int. Cl.
*G08B 29/12* (2006.01)
*G01R 19/00* (2006.01)
*G08B 25/04* (2006.01)

(58) Field of Classification Search
CPC ...... G08B 29/14; G08B 29/145; G08B 29/10; G06F 11/0766; G06F 11/00; H02J 7/0063; G01R 31/3606
See application file for complete search history.

(56) References Cited

U.S. PATENT DOCUMENTS

| | | | |
|---|---|---|---|
| 2010/0066552 | A1 | 3/2010 | Salgueiro et al. |
| 2010/0127849 | A1 | 5/2010 | Barrieau et al. |
| 2010/0265080 | A1* | 10/2010 | Henson .................. G08B 25/04 340/657 |
| 2013/0147495 | A1* | 6/2013 | Galera ................. G08B 29/123 324/658 |

OTHER PUBLICATIONS

Partial EP search report for corresponding EP application 14180729.7, dated Jan. 20, 2015.

Extended European search report from corresponding EP patent application 16163132.0, dated Aug. 2, 2016.

\* cited by examiner

APPARATUS AND METHOD FOR DETECTION AND ADAPTION TO AN END-OF-LINE RESISTOR AND FOR GROUND FAULT LOCALIZATION

CROSS-REFERENCE TO RELATED APPLICATIONS

This application claims priority to U.S. Provisional Patent Application No. 61/868,385 filed Aug. 21, 2013 and titled "Apparatus and Method for Detection and Adaption to an End-Of-Line Resistor and for Ground Fault Localization." U.S. Application No. 61/868,385 is hereby incorporated by reference.

FIELD

The present invention relates generally to alarm systems. More particularly, the present invention relates to an apparatus and method for detection and adaption to an end-of-line (EOL) resistor in a Notification Appliance Circuit (NAC) of a control panel or power booster of, for example, an alarm system, and for ground fault localization in the alarm system.

BACKGROUND

NACs are a critical part of alarm systems, for example, fire alarm systems, because they provide power and control to notification appliances, such as bells, horns, strobes, and the like, that must operate when evacuation from a region in alarm is necessary. Because of the critical nature of NACs, NACs must be supervised, that is, monitored for wiring faults.

Known NAC supervision schemes require EOL resistors at a far end of the NAC, and the value of such EOL resistors is often limited to a predetermined value, which can vary considerably from one model of a control panel to another. The value of an EOL resistor is critical because an incorrect value may cause supervision current to fall outside of a predetermined normal range.

For example, known NACs can be supervised by running a small current through the wiring of the NAC and the EOL resistor in a reverse direction. That is, when notification appliances are activated by current flowing from a positive terminal to a negative terminal, supervision current can flow from the negative terminal to the positive terminal. The supervision current can be measured, for example, with a resistor in series that develops a corresponding voltage that can be compared to high and low limits. The measured supervision current should fall within a predetermined normal range. Indeed, if the wiring is short circuited, the supervision current will be above the normal range. Similarly, if the wiring is open circuited, the supervision current will be below the normal range.

When replacing a control panel, such as a fire alarm control panel (FACP) in an existing building, that is, when retrofitting a control panel, problems can arise. For example, it can be difficult to locate and replace an existing EOL resistor when new equipment requires an EOL resistor with a different value. Some NACs address this problem by tuning the circuit, but the user must set or install a reference resistor that matches the existing EOL resistor. Accordingly, tuning the NAC can be a time consuming and inconvenient process.

Furthermore, many known NACs make a distinction only between the presence and absence of an EOL resistor and assume that an EOL resistor with a proper value is present. However, if an EOL resistor with an incorrect value is present, supervision may not function correctly. For example, a functioning circuit may be reported as faulty or vice versa. Additionally, the value of the EOL resistor may not be reported to a user because the resistance of the EOL cannot be accurately measured.

In addition to the above, when installing a control panel, for example, a FACP, or related equipment, it is often difficult to find and repair ground faults. Indeed, finding and repairing ground faults is often a time consuming process of troubleshooting to localize the fault to one particular circuit, and this can result in wasted time and extra expense. Some approaches have been developed to reduce the troubleshooting time, but these known solutions often require the expensive galvanic isolation of each NAC in a system.

In view of the above, there is a continuing, ongoing need for improved systems and methods.

DETAILED DESCRIPTION

Figure 1:
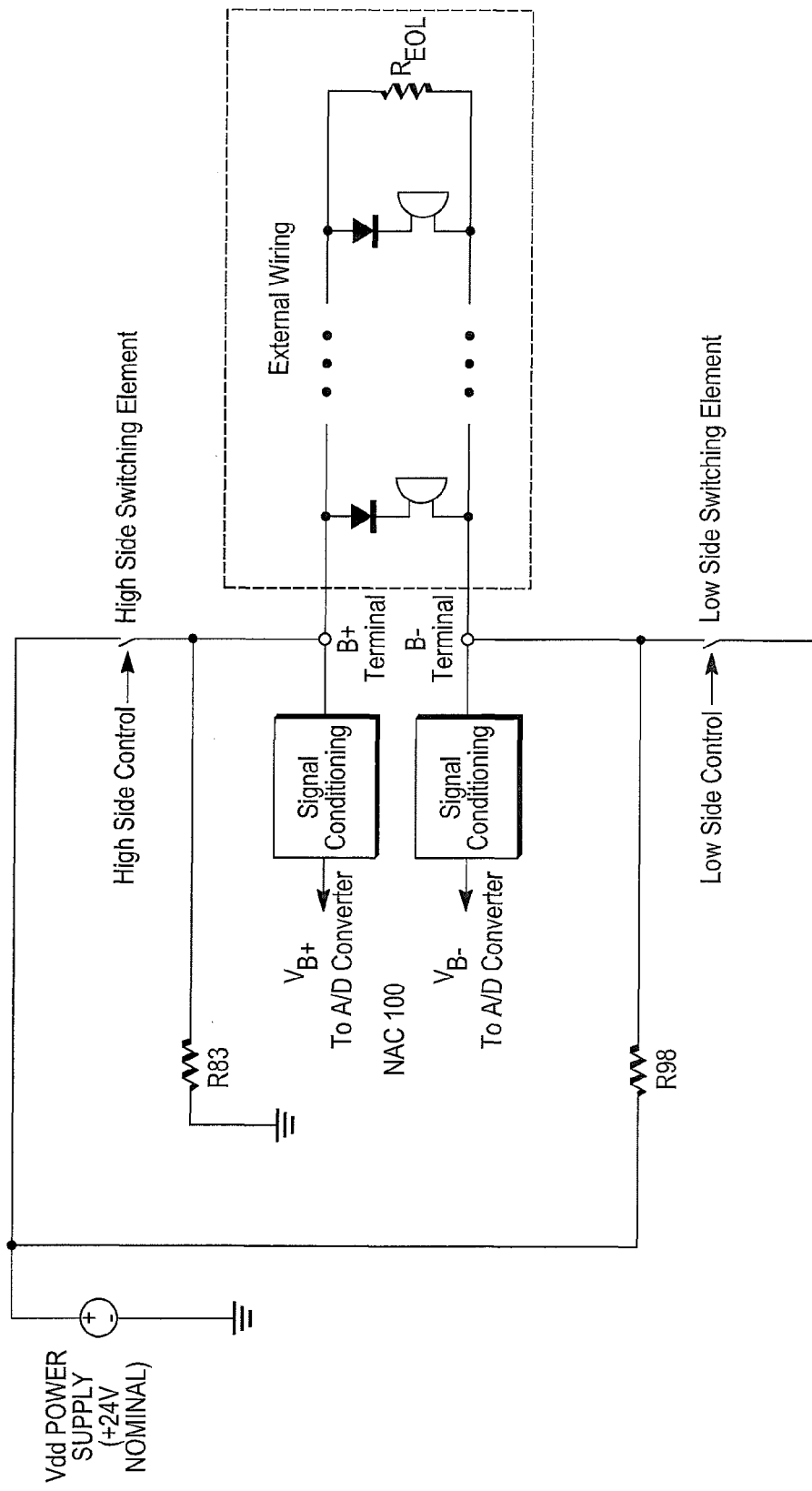
FIG. 1 is a circuit diagram of a Class B NAC in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein include an apparatus and method for detection and adaption to an EOL resistor in a NAC of a control panel or power booster of, for example, an alarm system, and for ground fault localization in the alarm system.

For example, in embodiments that include an apparatus and method for detection and adaption to an EOL resistor, some embodiments can enable a control panel, such as a FACP, or other device that includes one or more NACs, such as a NAC power booster, to automatically detect and adapt to a wide range of EOL resistor values. Accordingly, in a retrofit installation, a user need not locate and replace an existing EOL resistor and need not provide a reference resistor.

In accordance with the above, in some embodiments, an apparatus and method can accurately measure the resistance of an EOL resistor in a NAC as well as the negligible resistance of the NAC wiring. Once the resistance value is determined, the apparatus and method can determine whether the value is within a predetermined range of tolerance and can report the value to a user.

For example, instead of a single measurement of supervision current, an apparatus and method as disclosed herein can make two voltage measurements—one on each NAC terminal. Due to circuit topology, the two voltage measurements can yield a value of the supervision current as well as the voltage drop across external wiring. Then, using the two voltage measurements, the total external wiring resistance can be determined. That is, the resistance value of the EOL resistor and the NAC wiring can be determined.

Once the total external wiring resistance is determined, the control panel, such as the FACP or the NAC power booster, can compare the value of the EOL resistor to the predetermined range of tolerance. When the EOL resistor value is within the predetermined range, a user, such as a retrofit installer, need not make any changes to existing wiring before attaching new NAC hardware to the wiring. Indeed, the installer can be assured that no fault is detected and that the NAC will operate correctly with the new hardware. In some embodiments, the value of the EOL resistor can be reported, for example, to a user. However, it is to be understood that the specific value of the EOL resistor need not be determined as long as the value is determined to be within the predetermined range.

In embodiments that include an apparatus and method for ground fault localization, some embodiments can detect and report a ground fault for a specific NAC, thus eliminating many steps and costs associated with known troubleshooting processes.

As explained above, an apparatus and method in accordance with disclosed embodiments can measure voltage at each terminal of a NAC. Furthermore, an apparatus and method in accordance with disclosed embodiments can make use of the hardware features of a control panel to sense a change in NAC terminal voltage that results from a ground fault.

For example, a control panel, for example, a FACP, can introduce a small voltage differential between the earth ground potential of the electrical mains and any voltage the control panel drives onto its I/O terminals and thus, the external wiring. The presence of a ground fault, that is, a short between some part of the external wiring and earth ground, can produce a fault current that can be detected and reported. However, such detection and reporting does not indicate the location of the ground fault.

When the control panel monitors the voltage on each I/O terminal, the control panel can sense a change in the monitored voltage due to a ground fault. However, the change in voltage is often small due to the relative impedances of the I/O circuit and the ground offset drive circuit. Furthermore, when the change in voltage is small, it is often not possible to recognize a fault that exists on initial power up because the change in voltage may be within the normally expected range of voltages on a particular terminal.

Accordingly, in some embodiments disclosed herein, a control panel can change a ground offset voltage periodically under the control of a processor or the like. Then, the control panel can sense any change in the voltage of the I/O pins that correlates to the change in the ground drive voltage. This change will only occur on terminals of a circuit in which a ground fault is present. Accordingly, the control panel can identify the location of the fault.

In accordance with the above, a processor of a control panel, for example, a FACP, can detect and adapt to a wide range of EOL resistor values on the control panel's NACs. Accordingly, retrofit installations can be simplified because an installer need not find and replace existing EOL resistors.

In some embodiments, a control panel as disclosed herein can adapt to and/or operate normally with a range of EOL resistor values. For example, in some embodiments, a control panel can adapt to and/or operate normally with EOL resistor values from approximately 1 k Ohms to approximately 47 k Ohms. Furthermore, in some embodiments, a control panel as disclosed herein can calculate and report an actual EOL resistor value and/or can detect and localize a ground fault to a specific NAC.

In some embodiments, a control panel as disclosed herein, for example, a FACP, can drive the control panel's earth ground potential to two unique values and periodically switch between those two values. Furthermore, in some embodiments, the control panel can report voltage on both high-side (B+) and low-side (B−) terminals to a processor using, for example, separate 10-bit or 12-bit ND (analog-to-digital) converter channels. Because supervision current can be small for high EOL resistor values, for example, 300 µA at 47 k Ohms, supervision voltages can be filtered for noise.

In accordance with the above, a NAC as disclosed herein can be EOL-tolerant and use a high-side relay and low-side FET for switching, thereby allowing for strobe synchronization. Furthermore, a NAC as disclosed herein can be adapted to use full solid-state switching. For example, a NAC can use two digital control signals, one for each switch, one digital input for ON-state short detection, and two analog inputs for supervision.

In some embodiments, supervision can occur via polarity reversal. Supervision current can be derived from the full system voltage, Vdd. However, in embodiments disclosed herein, both supervision voltage and supervision current can be lower than in known circuit designs, and the value of an EOL resistor can be higher than in known circuit designs, thereby allowing for a greater potential for noise detection. This effect can be ameliorated with appropriate low-pass filtering and a printed circuit board (PCB) layout. Additionally, because an A/D converter of the circuit will expect to see low voltages, clamps can be provided to prevent the full system voltage from appearing at the A/D converter during the NAC ON state, thereby ensuring that the voltage appearing at the A/D converter does not exceed predetermined limits. Additionally or alternatively, the full system voltage can be diode-blocked from back feeding into the supervision voltage source.

For example, in some embodiments, the drive circuit can include a clamping mechanism that can ensure that the voltage across the output terminals and/or appearing at the A/D converter does not exceed predetermined limits, for example, 1V during synchronization pulses, even under ground fault conditions. It is to be understood that the A/D converter can be integrated in the processor or be a stand-alone chip, separate from the processor.

FIG. 1 is a circuit diagram of a NAC, for example, Class B NAC 100, in accordance with disclosed embodiments. As seen in FIG. 1, the NAC 100 can include two analog inputs so that the processor can read both external NAC terminals. Both of the analog input signals can be conditioned prior to application to an A/D converter, which can be either integral with or external to the processor. Such conditioning may include, but is not limited to, buffering, voltage division, clamping, sample-and-hold, and/or noise filtering. For example, for a 3.3V A/D converter, an optimal division ratio can be 8.5:1.

Although not shown in FIG. 1, it is to be understood that analog supervision voltage buffers and/or clamps come within the spirit and scope of embodiments disclosed herein. For example, in some embodiments, clamping the divided voltages so that they cannot exceed a converter's power rails can add further protection against noise spikes. Additionally or alternatively, in some embodiments, noise filtering can be provided with RC networks, DSP filtering, software averaging, and/or any combination thereof.

As seen in FIG. 1, the NAC 100 can include a 24V power supply. However, the power supply can vary, for example, when the power source is a backup battery. The power supply can be read by an A/D converter channel, and such a reading can be used to convert a supervision voltage reading to a value that is a percentage of Vdd, which will not vary as the battery discharges.

In accordance with the above, supervision can proceed by computing the state of the NAC 100 from raw high-side and raw low-side voltage measurements and from the change in those readings between the 2.0V and 0V ground-drive states. The state of the NAC 100 can be identified as open, shorted, ground faulted, or normal, and when the NAC 100 is determined to be in a normal, non-faulted state, a value for the EOL resistor can also be computed and reported by the processor.

In some embodiments, the processor can read the OFF-state NAC terminal voltages under two conditions: (1) when the earth ground drive voltage is at a first predetermined value, for example +2.0V offset from system common, and (2) when the earth ground drive voltage is at a second predetermined value, for example, 0.0V offset from system common. Furthermore, in some embodiments, the processor can know a predetermined value of a drive build-out impedance, for example, 6.8 k Ohms. When the processor has knowledge of the ground fault offset voltage and an associated build-out resistance, in some embodiments, the same processor can both monitor the NAC and control the ground drive. That is, the same processor can handle both supervision and ground-drive switching tasks.

However, when NACs are present on multiple units that are common grounded, it may not be possible for a single processor to handle both supervision and ground-drive switching tasks. In these embodiments, one unit can perform the ground-drive switching tasks, and the units can cooperate with one another. For example, the ground-drive switching unit can perform ground offset switching at an appropriate rate using compatible voltages and build-out impedance. Furthermore, the ground-drive switching unit can report all ground voltage transitions to the NAC supervision units.

An exemplary method of EOL-tolerant Class B NAC supervision is described below. However, it is to be understood that the specific steps and values described are exemplary only and do no limit the embodiments disclosed herein.

In accordance with disclosed embodiments, the ground drive voltage can be switched to 0V, and time can be allowed for settling. Then, NAC 100 terminal voltages V1-0 and V2-0 can be read and saved. Next, the ground drive voltage can be switched to 2V, and time can be allowed for settling. Then, NAC 100 terminal voltages V1-2 and V2-2 can be read and saved. Finally, the ground drive voltage can be switched back to 0V.

After the NAC 100 terminal voltages are measured as described above, the processor can execute computations to determine the condition of the NAC 100. For example, if V2-0<5% of the supervision voltage and if V1-0>85% of the supervision voltage, then the processor can determine that the NAC state is open. However, if V2-0<5% of the supervision voltage and if V1-0 is not greater than 85% of the supervision voltage, then the processor can determine that the high-side of the NAC is shorted to the system common.

If V2-0 is not less than 5% of the supervision voltage and if the magnitude of (V2-0–V1-0)<5% of the supervision voltage, then the processor can determine that the state of the NAC is shorted.

In all conditions, $\Delta V1$ can be calculated as the magnitude of (V1-2–V1-0), that is, the change in voltage on a first terminal as a result of the change in ground drive voltage, and $\Delta V2$ can be calculated as the magnitude of (V2-2–V2-0), that is, the change in voltage on a second terminal as a result of the change in ground drive voltage. Then, if either $\Delta V1$ or $\Delta V2$ exceeds 1% of the supervision voltage, then the processor can determine that the NAC has a ground fault.

However, if none of the above-identified conditions are met, then the processor can determine that the NAC is in a normal state and can compute the value of the EOL resistor as $R_{EOL}=(V1-V2)/I$, where I is the supervision current in the circuit.

Embodiments disclosed herein can be used in connection with any horn and/or strobe unit known in the art and with any EOL resistor known in the art having a value within a predetermined range, for example, between 1 k Ohms and 47 k Ohms.

Figure 2:
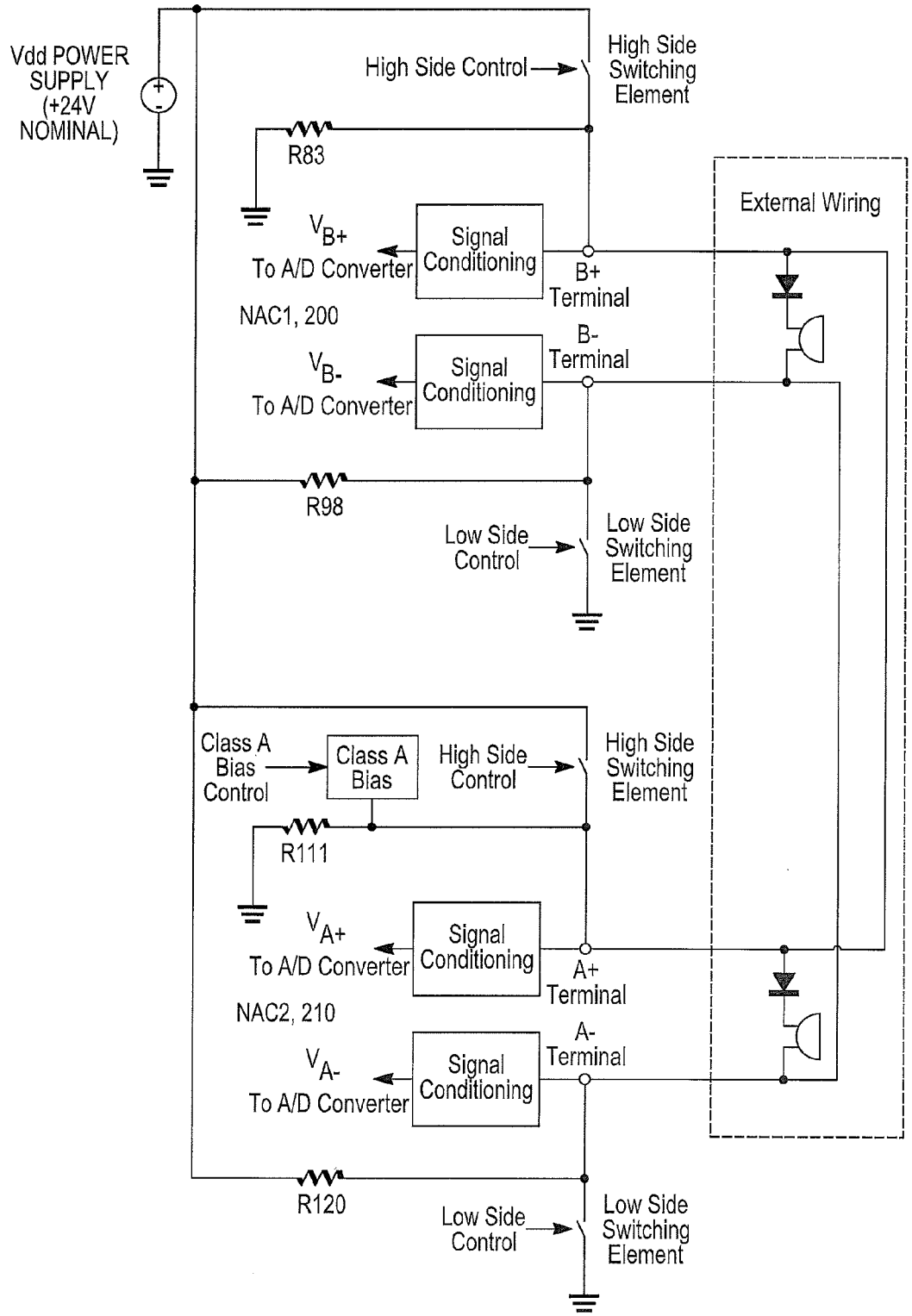
FIG. 2 is a circuit diagram of two Class B NACs connected for Class A operation in accordance with disclosed embodiments.

Embodiments disclosed herein can include various NAC topologies, including, for example, individual Class A or Class B NACs and/or Class B NACs that can be paired to provide Class A operation. For example, some embodiments disclosed herein can include one or more pairs of Class B NACs that may be interconnected as a Class A NAC. Indeed, FIG. 2 is a circuit diagram of two Class B NACs 200, 210 connected for Class A operation in accordance with disclosed embodiments. As seen in FIG. 2, neither of the NACs 200, 210 includes an EOL resistor.

An exemplary method of Class A supervision of the paired NACs, NAC1 200 and NAC2 210, is described below. However, it is to be understood that the specific steps and values described are exemplary only and do not limit the embodiments disclosed herein.

In accordance with disclosed embodiments, the high-side of both NAC1 200 and NAC2 210 can be switched off and remain off throughout the supervision process. The ground drive voltage can be switched to 0V, the low-side of both NAC1 200 and NAC2 210 can be turned off, and Class A operation bias can be turned off. Then, a predetermined amount of time, for example, 2.4 seconds, can be allowed for settling, and high and low side NAC terminal voltages of both NAC1 200 and NAC2 210 can be read and saved as Vhi[0] and Vlo[0].

Next, the ground drive voltage can be switched to 2V, the low-side of NAC1 200 can be turned on, and Class A operation bias can be turned off. Then, a predetermined amount of time can be allowed for settling, and high and low side NAC terminal voltages of both NAC1 200 and NAC2 210 can be read and saved as Vhi[1] and Vlo[1].

Next, the ground drive voltage can be switched back to 0V, the low-side of NAC1 200 can be turned off, and Class A operation bias can be turned on. Then, a predetermined amount of time can be allowed for settling, and high and low side NAC terminal voltages of both NAC1 200 and NAC2 210 can be read and saved as Vhi[2] and Vlo[2].

Finally, the ground drive voltage can be switched back to 2V, the low-side of NAC1 200 can be turned off, and Class A operation bias can be turned off. Then, a predetermined amount of time can be allowed for settling, and high and low side NAC terminal voltages of both NAC1 200 and NAC2 210 can be read and saved as Vhi[3] and Vlo[3].

After the NAC terminal voltages are measured as described above, the processor can perform Class A auto-detection as described herein, perform supervision of both NACs as described herein, and perform ground fault supervision as described herein.

When performing Class A auto-detection, for each NAC, the processor can determine whether terminal voltage readings indicate an open circuit. For example, a NAC can appear to be open if Vhi[0] is near 0V and Vlo[0] is near Vdd, that is, the full system voltage.

If NAC1 200 and NAC2 210 both appear to be open and the high-side terminals have continuity, that is, Vhi for NAC1 200 responded when Class A operation was turned on, or the low-side terminals have continuity, that is, Vlo for NAC2 210 responded when the low-side of NAC1 200 was turned on, then the processor can determine that NAC1 200 and NAC2 are a Class A pair.

When the processor determines that two Class B NACs are a Class A pair, the processor can perform Class A supervision on those NACs. Otherwise, the processor can perform Class B supervision as described above.

When performing Class A supervision, for each NAC, the processor can calculate the average of terminal voltage readings over a period of time and use the calculated averages to execute computations to determine the condition of the NAC.

For example, the processor can calculate the magnitude of (Vhi[0]−Vlo[0]) for NAC1 200 and calculate that magnitude in terms of its percentage of the full Vdd. If less than 5%, then the processor can determine that NAC1 200 is shorted. Furthermore, the processor can perform a similar calculation and make a similar determination for NAC2 210.

If the processor determines that neither NAC1 200 nor NAC2 210 is shorted, then the processor can determine whether NAC2 Vlo[1] is greater than 1% of Vdd. If so, then the processor can determine that NAC1 200 is open. The processor can also determine whether NAC1 Vhi[2] is less than 6% of Vdd while NAC2 Vhi[2] is greater than 6% of Vdd. If so, the processor can determine that the NAC2 210 is open.

If the processor determines that neither NAC1 200 nor NAC2 210 is shorted or open, then the processor can calculate ΔV as the magnitude of (Vhi[3]−Vhi[0]) for both NAC1 200 and NAC2 210. Then, the processor can determine whether ΔV is greater than 0.5% of Vdd for either NAC1 200 or NAC2 210, or whether Vlo[0] is less than 85% of Vdd for either NAC1 200 or NAC2 210. If so, then the processor can determine that the respective NAC has a ground fault.

However, if none of the above-identified conditions are met, then the processor can determine that the NAC is in a normal state. It is to be understood that it is not necessary to calculate or report a value of an EOL resistor because there need not be an EOL resistor when NACs are paired for Class A operation.

Whether the NACs as disclosed herein are Class A or Class B, the supervision processes disclosed herein can be performed and executed continually as long as the NACs are in a standby state, that is, as long as the NACs are not energized.

It is to be understood that the processors described herein can include control circuitry, one or more programmable processors, and/or executable control software. The executable control software can be stored on a transitory or nontransitory computer readable medium, including, but not limited to local computer memory, RAM, optical storage media, magnetic storage media, flash memory, and the like.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. An apparatus comprising:
    a notification appliance circuit,
    wherein the notification appliance circuit includes a high side input terminal and a low side input terminal,
    wherein the notification appliance circuit includes a first external output terminal and second external output terminal,
    wherein the notification appliance circuit includes an end-of-line resistor separated from the first external output terminal and the second external output terminal by external wiring,
    wherein current is driven through the notification appliance circuit via the high side input terminal and the low side input terminal,
    wherein a first voltage is measured at the first external output terminal and a second voltage is measured at the second external output terminal when a ground offset voltage of the notification appliance circuit is driven to a first level at the low side input terminal,
    wherein the first voltage and the second voltage are indicative of one of a value of the end-of-line resistor,
    wherein a third voltage is measured at the first external output terminal and a fourth voltage is measured at the second external output terminal when the ground offset voltage of the notification appliance circuit is driven to a second level at the low side input terminal, and
    wherein at least some of the first voltage, the second voltage, the third voltage, and the fourth voltage are indicative of a state of the notification appliance circuit being one of open, shorted, ground faulted, and normal.

2. The apparatus of claim 1 wherein a difference between the first voltage and the second voltage is indicative of the value of the end-of-line resistor.

3. The apparatus of claim 1 wherein, when a difference between the first voltage and the second voltage is outside of a predetermined range, the state of the notification appliance is open.

4. The apparatus of claim 1 wherein, when a difference between the first voltage and the second voltage is within a predetermined range, the state of the notification appliance circuit is shorted.

5. The apparatus of claim 1 wherein, when a first difference between a first voltage drop and a second voltage drop is outside of a predetermined range, the state of the notification appliance is ground faulted, wherein the first voltage drop is a second difference between the first voltage and the second voltage, and wherein the second voltage drop is a third difference between the third voltage and the fourth voltage.

6. The apparatus of claim 1 wherein the first external output terminal is associated with a high side of the notification appliance circuit, and wherein the second external output terminal is associated with a low side of the notification appliance circuit.

* * * * *